United States Patent
Shiobara et al.

(10) Patent No.: US 11,974,389 B2
(45) Date of Patent: Apr. 30, 2024

(54) LOW DIELECTRIC SUBSTRATE FOR HIGH-SPEED MILLIMETER-WAVE COMMUNICATION

(71) Applicant: SHIN-ETSU CHEMICAL CO., LTD., Tokyo (JP)

(72) Inventors: Toshio Shiobara, Annaka (JP); Yusuke Taguchi, Takasaki (JP); Ryunosuke Nomura, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 18/118,915

(22) Filed: Mar. 8, 2023

(65) Prior Publication Data

US 2023/0247759 A1 Aug. 3, 2023

Related U.S. Application Data

(63) Continuation of application No. 17/571,585, filed on Jan. 10, 2022, now Pat. No. 11,678,432.

(30) Foreign Application Priority Data

Jan. 29, 2021 (JP) ................................ 2021-013654

(51) Int. Cl.
*H05K 1/02* (2006.01)
*H05K 1/03* (2006.01)

(52) U.S. Cl.
CPC ........... *H05K 1/024* (2013.01); *H05K 1/0248* (2013.01); *H05K 1/0306* (2013.01); *H05K 2201/015* (2013.01); *H05K 2201/0175* (2013.01); *H05K 2201/0195* (2013.01); *H05K 2201/0209* (2013.01)

(58) Field of Classification Search
CPC ..... H05K 1/024; H05K 1/0248; H05K 1/0306
See application file for complete search history.

(56) References Cited

U.S. PATENT DOCUMENTS

| | | |
|---|---|---|
| 5,202,104 A | 4/1993 | Watanabe et al. |
| 2019/0289713 A1 | 9/2019 | Shimauchi et al. |
| 2020/0223998 A1 | 7/2020 | Hoshino et al. |
| 2020/0270411 A1 | 8/2020 | Kitai et al. |
| 2021/0214523 A1 | 7/2021 | Chikara |

FOREIGN PATENT DOCUMENTS

| | | |
|---|---|---|
| JP | H02-289416 A | 11/1990 |
| JP | H05-170483 A | 7/1993 |
| JP | 2019-155853 A | 9/2019 |
| WO | 2019/065940 A1 | 4/2019 |
| WO | 2020/004225 A1 | 1/2020 |

OTHER PUBLICATIONS

Asano, Hitoshi, "Change in OH Group Concentration in Silica Glass Accompanying Heat Treatment," Master's Program, Graduate School of Engineering, University of Fukui Department of Applied Physics, Department of Molecular Sicence, Feb. 2011.
Fujii, Kenji, "Structural Change in Silica Glass Block Due to Heat Treatment" Master's Program, Graduate School of Engineering, University of Fukui Department of Applied Physics, Department of Molecular Science, Feb. 2005.
Nov. 28, 2023 Office Action issued in Japanese Patent Application No. 2021-013654.

*Primary Examiner* — Jeremy C Norris
(74) *Attorney, Agent, or Firm* — Oliff PLC

(57) ABSTRACT

A low dielectric substrate for high-speed millimeter-wave communication includes a quartz glass cloth with a dielectric loss tangent of 0.0001 to 0.0015 and a dielectric constant of 3.0 to 3.8 at 10 GHz, and an organic resin with a dielectric loss tangent within 80% to 150% of the dielectric loss tangent of the quartz glass cloth at 10 GHz and a dielectric constant within 50% to 110% of the dielectric constant of the quartz glass cloth at 10 GHz. This provides a low dielectric substrate for high-speed millimeter-wave communication where the low dielectric substrate makes it possible to send signals that are stable and have excellent quality with no difference in propagation time between wirings even if the substrate has an uneven resin distribution and the quartz glass cloth above and below the wirings, and the difference in dielectric loss tangent between members has been reduced to lower transmission loss.

20 Claims, No Drawings

LOW DIELECTRIC SUBSTRATE FOR HIGH-SPEED MILLIMETER-WAVE COMMUNICATION

CROSS REFERENCE TO RELATED APPLICATIONS

This is a Continuation of application Ser. No. 17/571,585 filed Jan. 10, 2022, which claims priority to JP 2021-013654 filed Jan. 29, 2021. The disclosure of the prior applications is hereby incorporated by reference herein in its entirety.

TECHNICAL FIELD

The present invention relates to a substrate including a quartz glass cloth and an organic resin having low dielectric characteristics: a low dielectric substrate for high-speed millimeter-wave communication.

BACKGROUND ART

With the development of high-speed communication, such as 5G, substrates for high-speed communication and antenna substrates have been strongly desired, the substrates having little transmission loss and skew even when using a high frequency such as a millimeter wave. In addition, in information terminals such as smartphones, circuit boards have come to have high density mounting and to be extremely thin with remarkable progress.

In particular, in high-speed substrates for over 25 GHz, it has become difficult to ensure signal quality by an extension of conventional techniques.

A laminated plate for such a high-speed communication such as 5G is widely used today. The laminated plate is achieved by laminating prepregs and curing under heat and pressure. The prepregs are obtained by impregnating a low dielectric glass cloth, such as D glass, NE glass, and L glass, with a resin that includes a thermoplastic resin such as a fluorine resin or polyphenylene ether, and further includes a low dielectric epoxy resin, a low dielectric maleimide resin, or the like. However, regarding glass cloths with improved dielectric characteristics such as D glass, NE glass, and L glass, each glass has a large dielectric loss tangent of about 0.002 to 0.005 and a large dielectric constant of approximately 5 in a high frequency region of 10 GHz or more. When using a high frequency such as millimeter waves for communication, the reduction of the dielectric loss tangent and the dielectric constant of the organic resin to be a matrix is attempted in order to reduce transmission loss. However, deviation from the dielectric characteristics of the low dielectric glass becomes large, so that skew and transmission loss become large, and it becomes difficult to transmit accurate information.

Regarding skew, the wavelength becomes short in high-frequency signals of millimeter waves or the like, so that distribution of the resin and glass cloth on both sides of wires of the differential pair cause a difference in propagation time between the two lines. This causes degradation in signal quality.

The problem of reducing the skew has conventionally been dealt with by the following techniques: wiring the signal wires so as to tilt relative to the fiber direction of the glass cloth; and reducing portions having a large difference in dielectric constant by using a fibrillated glass cloth weaved with flat glass fiber bundles to make the distribution of the resin and the glass cloth uniform.

Both of these techniques lead to a rise in costs. In addition, since a difference in dielectric constant and dielectric loss tangent between the resin and the glass cloth remains, it is necessary to take the above measures considering the transmission of high-speed signals such as millimeter waves, and such substrates are not sufficient as high-performance substrates applicable to millimeter waves.

Note that it is known that a material having a smaller dielectric constant ($\varepsilon$) and dielectric loss tangent (tan $\delta$) has a more improved transmission loss of a signal, as shown by the Edward A. Wolff formula:

transmission loss~(is proportional to)$\sqrt{\varepsilon} \times \tan \delta$.

As the formula shows, the dielectric loss tangent has a particularly strong influence.

In order to achieve a low dielectric loss tangent in an organic resin substrate such as a printed circuit board, a common method is to use an inorganic powder or a glass cloth each having a lower dielectric loss tangent than the organic resin. However, in such a substrate, the dielectric characteristics of the resin to be a binder are different from the dielectric characteristics of the inorganic powder or glass cloth when seen on a microscopic scale, so that it is impossible to obtain a low dielectric substrate having uniform dielectric characteristics. In particular, hardly any substrates having uniform dielectric characteristics of a dielectric loss tangent of less than 0.0015 and a dielectric constant of 4.0 or less are known in a high frequency region.

Silica powder is a typical inorganic material having low dielectric characteristics, and quartz glass cloth is also. Silica powder is used as an inorganic powder for adding in resin, and quartz glass cloth is used as reinforcement for substrates. These have a small expansion coefficient, and are also materials excellent in insulation and dielectric characteristics. Generally, quartz glass cloth and silica powder are known to have extremely excellent dielectric characteristics. However, the dielectric loss tangent of currently available quartz glass cloth and silica powder cannot be adjusted at will.

It is generally known that an amount of hydroxy group (OH group) remaining in a quartz glass or silica powder varies depending on manufacturing method and heat treatment, and that the difference in OH concentration brings difference in various physical properties (Non Patent Document 1).

In Patent Document 1, a low-silanol silica is manufactured by a heat treatment. However, only the reduction rate of the number of the silanol groups (Si—OH groups) is mentioned, and the silanol amount of the heat-treated silica is not measured. Moreover, there is no mention of correlation with the dielectric loss tangent.

Patent Document 2 describes the relation between the water amount in a silica glass fiber and dielectric loss tangent. However, the document contains no mention of the silanol amount, and shows only the value of the dielectric loss tangent measured for a printed substrate including a glass fiber and PTFE. Therefore, the correlation between the silanol amount and the dielectric loss tangent of the glass fiber is unclear.

Reducing OH groups to a predetermined amount by a high-temperature treatment in order to improve dielectric loss tangent is not known. In addition, distortion is increased if a quartz glass or silica powder is heat-treated at a high temperature, and the distortion is increased particularly on the glass surface (Non Patent Document 2), so that strength is greatly degraded. Therefore, this has not been put to practical use.

CITATION LIST

Patent Literature

Patent Document 1: JP H2-289416 A
Patent Document 2: JP H5-170483 A

Non Patent Literature

Non Patent Document 1: Netsu shori ni tomonau shirika garasu chu no OH ki noudo henka (Change in OH Group Concentration in Silica Glass Accompanying Heat Treatment) February, 2011, University of Fukui, Graduate School of Engineering, Thesis for Master's Program Non Patent Document 2: Shirika garasu burokku no netsu shori niyoru kouzou henka (Structural Change in Silica Glass Block Due to Heat Treatment) February, 2005, University of Fukui, Graduate School of Engineering, Thesis for Master's Program

SUMMARY OF INVENTION

Technical Problem

If the dielectric characteristics, in particular, dielectric loss tangent of existing quartz glass cloth and silica powder can be lowered to the intrinsic level of quartz glass, about less than 0.0015, quartz glass cloth and silica powder can be developed for a wide variety of uses. This includes use as encapsulants for semiconductors for high-speed communication and the like, and as reinforcement or fillers for substrates for high-speed communication, antenna substrates, and the like. These are expected to be greatly developed hereafter. Meanwhile, the dielectric substance of such a substrate is constituted from a composite material of a quartz glass cloth, an inorganic powder such as a silica powder, and a resin as described above, and therefore, the inner structure of the substrate is uneven. The wirings provided on the substrate are influenced by the surrounding environment (material, dielectric characteristics, etc.), so that the unevenness of the substrate causes a difference in propagation speed of signals in each wire in a differential wiring pair.

However, it has not been possible to adjust the value of the dielectric loss tangent of quartz glass cloth and silica powder at will in the past. Therefore, it has only been possible to obtain an organic resin substrate in which the dielectric characteristics of the members (organic resin, silica powder, glass cloth, etc.) constituting the substrate differ from one another. In such a substrate, dielectric characteristics vary among parts constituted from members having different dielectric characteristics when seen on a microscopic level, so that it is impossible to obtain a low dielectric substrate having uniform dielectric characteristics. In particular, when high-frequency waves such as millimeter waves are used in communication, it is necessary to reduce the dielectric loss tangent and the dielectric constant of the organic resin to be a matrix in order to reduce transmission loss. However, since there is a great deviation in the dielectric characteristics between the members constituting the organic resin substrate as described above, there has been a problem that skew, which is a difference in propagation delay time that occurs between differential wirings, and transmission loss are on a level that cannot be disregarded, and that accurate information cannot be sent.

The present invention has been made to solve the above-described problems, and an object thereof is to provide a low dielectric substrate for high-speed millimeter-wave communication, including a quartz glass cloth, a low dielectric resin, and a silica powder, which is added as necessary. The low dielectric substrate allows the transmission of stable and good-quality signals with no difference in propagation time between wirings even when the substrate has an uneven distribution of the resin and the quartz glass cloth above and below various wirings, and the difference in dielectric loss tangent between members has been reduced to reduce transmission loss.

Solution to Problem

To achieve the object, the present invention provides a low dielectric substrate for high-speed millimeter-wave communication comprising a quartz glass cloth and an organic resin, wherein the quartz glass cloth has a dielectric loss tangent of 0.0001 to 0.0015 at 10 GHz and a dielectric constant of 3.0 to 3.8 at 10 GHz, and the organic resin has a dielectric loss tangent within a range of 80% to 150% of the dielectric loss tangent of the quartz glass cloth at 10 GHz and a dielectric constant within a range of 50% to 110% of the dielectric constant of the quartz glass cloth at 10 GHz.

With such a low dielectric substrate for high-speed millimeter-wave communication, there is no variation in propagation time between wirings, so that stable signals of good quality can be sent even when the substrate has an uneven distribution of the resin or the quartz glass cloth above and below the wirings. In addition, transmission loss can be reduced by reducing the difference in dielectric loss tangent between members.

The inventive low dielectric substrate for high-speed millimeter-wave communication may further comprise a silica powder having an average particle size of 30 μm or less.

When such a silica powder is contained, it is possible to adjust the expansion coefficient, modulus of elasticity, etc. of the substrate.

In this case, the silica powder preferably has a dielectric loss tangent of 0.0001 to 0.0015 at 10 GHz and a dielectric constant of 3.0 to 3.8 at 10 GHz.

Such a low dielectric substrate for high-speed millimeter-wave communication can remarkably improve its dielectric characteristics by reducing the difference from the quartz glass cloth or organic resin in dielectric characteristics while adjusting the expansion coefficient, modulus of elasticity, and so forth of the substrate by loading the silica powder. In addition, transmission loss can be reduced further.

Furthermore, in the present invention, the organic resin preferably has a dielectric loss tangent of 0.0001 to 0.0020 at 10 GHz and a dielectric constant of 2.0 to 4.0 at 10 GHz.

Such an organic resin is suitable for achieving a low dielectric substrate, and transmission loss can be further reduced by bringing the dielectric loss tangents between the members closer to one another.

Furthermore, the inventive low dielectric substrate for high-speed millimeter-wave communication preferably has a dielectric loss tangent of 0.0001 to 0.0015 at 10 GHz and a dielectric constant of 2.0 to 3.8 at 10 GHz.

Such a low dielectric substrate for high-speed millimeter-wave communication is suitable for use in high-speed communication such as 5G.

Furthermore, in the present invention, the organic resin is preferably a fluorine-based resin.

Such an organic resin is excellent in view of low dielectric characteristics.

In this case, the fluorine-based resin is preferably a polytetrafluoroethylene derivative, and the low dielectric substrate for high-speed millimeter-wave communication preferably has a dielectric loss tangent of 0.0001 to 0.0005 at 10 GHz and a dielectric constant of 2.2 to 3.7 at 10 GHz.

Such a substrate is particularly excellent in low dielectric characteristics, and is ideal, having very little transmission loss and skew in high-speed communication using millimeter waves or the like.

Advantageous Effects of Invention

As described above, the inventive low dielectric substrate for high-speed millimeter-wave communication includes a quartz glass cloth, an organic resin, and a silica powder, which is added as necessary. When the dielectric characteristics (dielectric loss tangent and dielectric constant) of the quartz glass cloth and the organic resin respectively satisfy predetermined conditions, it is possible to send signals that are stable and have favorable quality with no difference in propagation time between wirings even if the substrate has an uneven distribution of the resin and the quartz glass cloth above and below the wirings. Moreover, variation in characteristics of dielectric loss tangent depending on the member is reduced, so that it is possible to achieve a low dielectric substrate for high-speed millimeter-wave communication with a low transmission loss to the limit.

DESCRIPTION OF EMBODIMENTS

As described above, in high-speed communication using millimeter waves or the like, it has been desired to develop an ideal resin substrate with very little transmission loss and skew.

The present inventors have considered that if the dielectric characteristics, in particular, dielectric loss tangent of existing silica powder and quartz glass cloth can be lowered to the intrinsic level of quartz glass, quartz glass cloth and silica powder can be developed for a wide variety of uses. This includes use as encapsulants for semiconductors for high-speed communication and the like, and as reinforcement or fillers for substrates for high-speed communication, antenna substrates, and the like. These are expected to be greatly developed hereafter. Thus, the present inventors have carried out various studies.

Accordingly, the present inventors have earnestly studied to solve the above-described problem, in particular, conducted a study on achieving low dielectricity, and found out the following: the dielectric constant can be lowered by raising the purity of the silica or quartz glass cloth as much as possible; heating a silica powder or quartz glass cloth at a temperature of 500° C. to 1500° C. is effective for lowering the dielectric loss tangent; slightly etching a surface of the silica powder or quartz glass cloth enables the surface to become hard to improve the adhesion with resin; and further, in the quartz glass cloth, the tensile strength of the cloth is greatly improved.

Furthermore, the present inventors have found out: that the dielectric loss tangent of quartz glass cloth and silica powder is variable at will; and that it is possible to achieve the above objective of providing a low dielectric substrate for high-speed millimeter-wave communication with little variation of dielectric loss tangent characteristics between members by combining a quartz glass cloth and a silica powder having a dielectric loss tangent in accordance with the dielectric loss tangent characteristics of a low dielectric resin. Thus, the present invention has been completed.

That is, the present invention is a low dielectric substrate for high-speed millimeter-wave communication comprising a quartz glass cloth and an organic resin, wherein the quartz glass cloth has a dielectric loss tangent of 0.0001 to 0.0015 at 10 GHz and a dielectric constant of 3.0 to 3.8 at 10 GHz, and the organic resin has a dielectric loss tangent within a range of 80% to 150% of the dielectric loss tangent of the quartz glass cloth at 10 GHz and a dielectric constant within a range of 50% to 110% of the dielectric constant of the quartz glass cloth at 10 GHz.

Hereinafter, the present invention will be described in detail, but the present invention is not limited thereto.

The inventive low dielectric substrate for high-speed millimeter-wave communication contains a quartz glass cloth and an organic resin (low dielectric resin). If necessary, an inorganic powder such as a silica powder or other components may be contained. Below, members (components) constituting the substrate will be described.

[Quartz Glass Cloth]

As the material of the quartz glass cloth to be used in the present invention, a naturally produced quartz with little impurity or a synthetic quartz made from raw materials such as silicon tetrachloride can be mainly used.

The impurity concentration in the quartz glass material is more preferably as follows: a sum total of alkali metal such as Na, K, and Li, of 10 ppm or less; 1 ppm or less of B; 1 ppm or less of P; and to prevent malfunction due to radiation, U and Th contents of 0.1 ppb or less each. The concentrations of the above impurities can be measured by atomic absorption spectrophotometry, inductively coupled plasma (ICP) emission spectroscopy, or the like. For example, the concentrations can be determined from a calibration curve made by using a sample with concentrations known beforehand from an apparatus such as ICP-AES, and ICP-MS.

The quartz glass cloth of the present invention can be manufactured by producing a filament or yarn from a quartz ingot obtained in the following manner as the raw material and weaving.

A quartz ingot can be manufactured by an electric melting method or a flame-fusion method with naturally produced quartz as a raw material; a direct synthesis method, a plasma synthesis method, or a soot method with silicon tetrachloride as a raw material; or a sol-gel method with alkyl silicate as a raw material; or the like.

For example, a quartz yarn with a diameter of 100 to 300 µm to be used in the present invention can be manufactured by melting an ingot at 1700 to 2300° C., extending, and winding.

Note that in the present description, the thin thread-like filament obtained by extending a quartz yarn as described above is defined as a quartz glass filament, bundled quartz glass filaments as a quartz glass strand, and bundled and further twisted quartz glass filaments as a quartz glass yarn.

In the case of a quartz glass filament, the diameter thereof is preferably 3 µm to 20 µm, more preferably 3.5 µm to 9 µm. Methods for manufacturing a quartz glass filament include the above-described extending methods and the like by electric melting and oxyhydrogen flame using quartz yarn. However, the manufacturing methods are not limited thereto as long as the quartz glass filament diameter is 3 µm to 20 µm.

A quartz glass strand is preferably manufactured by bundling 10 to 400 of the quartz glass filaments, more preferably 40 to 200.

Furthermore, the quartz glass cloth to be used in the present invention can be manufactured by weaving the above-described quartz glass yarn or strand. There is no particular restriction to the method for weaving a quartz glass cloth, and examples include weaving by a rapier loom, a shuttle loom, and an air jet loom.

Currently available quartz glass cloths that can be obtained by this kind of manufacturing method have better dielectric characteristics than LE glass or the like known as low dielectric glass. LE glass, which is known as low dielectric glass, has a dielectric constant of 4.4 and a dielectric loss tangent of 0.0020. The dielectric constant is about 20% greater than the 3.7 of the intrinsic dielectric constant of quartz, and the dielectric loss tangent has a value of one digit larger than 0.0001.

For this reason, when used for a substrate for high-speed millimeter-wave communication, the dielectric constant of currently available low dielectric LE glass cannot be close to the dielectric constant of the organic resin to be the matrix of the substrate, since the resin has a small dielectric constant of 3.0 or less.

[Low Dielectric Quartz Glass Cloth]

The quartz glass cloth used in the present invention has a dielectric loss tangent of 0.0001 to 0.0015 at 10 GHz and a dielectric constant of 3.0 to 3.8 at 10 GHz, and the applied organic resin has a dielectric loss tangent within a range of 80% to 150% of the dielectric loss tangent of the quartz glass cloth at 10 GHz and a dielectric constant within a range of 50% to 110% of the dielectric constant of the quartz glass cloth at 10 GHz. Other characteristics are not particularly limited. However, it is preferable to use a low dielectric quartz glass cloth on the basis of the following knowledge in view of dielectric characteristics and mechanical strength.

The present inventors have found out that it is possible to manufacture a resin substrate excellent in dielectric characteristics by using a low dielectric quartz glass cloth obtained as follows: a quartz glass cloth having a dielectric loss tangent of less than 0.0010 at 10 GHz and a dielectric constant of 3.0 to 3.8 at 10 GHz in a high frequency region and tensile strength of 2.7 N/25 mm or more per cloth weight ($g/m^2$) is subjected to a high-temperature treatment at a temperature of 500° C. or higher; and then, a strained layer on the surface of the fibers configuring the cloth is removed.

In the present invention, preferably, the above-described quartz glass cloth is heat-treated at a high temperature to remove the hydroxy groups present in the quartz, then the strained layer generated on the quartz glass surface is dissolved and removed, and the resultant quartz glass surface is treated with a coupling agent or the like to give a low dielectric quartz glass cloth, and this low dielectric quartz glass cloth is used.

When removing the hydroxy groups in the quartz, the heating temperature can be 500° C. to 1500° C., and the heating time can be 10 minutes to 24 hours. Note that the cooling to room temperature after heating can be either slow or rapid. However, depending on conditions, the heating temperature and cooling conditions are preferably optimized since quartz glass in a molten state sometimes partially crystalizes. The heating atmosphere is not particularly limited, and can be in the air or in an inert gas such as nitrogen under normal or reduced pressure, or in a vacuum. However, heating is usually performed in the air considering cost, etc. The degree of decrease in the hydroxy groups attributable to the heat treatment can be analyzed by infrared spectroscopic analysis or the like to observe whether the desired dielectric characteristics have been reached.

By adjusting the heating temperature and the heating time in this step, the dielectric loss tangent at 10 GHz can be freely controlled within a range of 0.0001 to 0.0015, which is the intrinsic level of quartz, without the dielectric constant fluctuating. To achieve a low dielectric substrate, the dielectric loss tangent is preferably 0.0001 to 0.0010, more preferably 0.0001 to 0.0008, and further preferably 0.0001 to 0.0005.

Even after the treatment, the dielectric constant of the quartz glass cloth hardly changes from before the treatment, falls in the range of 3.0 to 3.8, and exhibits excellent characteristics.

When a quartz glass cloth is heat-treated at a temperature of 500° C. or higher, strength is sometimes degraded. It is considered that this is caused in the following manner: a slight strain remains in the surface layer of the quartz glass cloth after the heat treatment at a high temperature, and the quartz glass cloth easily breaks from this strain. Accordingly, in such a case, it is preferable to use a low dielectric quartz glass cloth with the strained layer removed and the strength recovered.

The strained layer of the quartz glass cloth can be removed easily by immersing the cloth in an etching solution or the like.

Furthermore, when manufacturing a prepreg, a surface treatment can be performed with a silane coupling agent in order to strengthen the adhesion between the resin and the glass cloth surface. In the surface treatment, after the quartz glass cloth is treated at a high temperature and etched, the quartz glass cloth is cleaned, and then the surface of the glass cloth is coated with a silane coupling agent.

As the silane coupling agent, a known silane coupling agent can be used, and alkoxysilane is preferable. As typical silane coupling agents, one or more types selected from the group consisting of the following are preferable: amino-based silane coupling agents such as 3-aminopropyltrimethoxysilane (manufactured by Shin-Etsu Chemical Co., Ltd., product name: KBM-903), 3-aminopropyltriethoxysilane (manufactured by Shin-Etsu Chemical Co., Ltd., product name: KBE-903), N-2-(aminoethyl) aminopropyltrimethoxysilane (manufactured by Shin-Etsu Chemical Co., Ltd., product name: KBM-603), and N (aminoethyl)-3-aminopropyltriethoxysilane (manufactured by Shin-Etsu Chemical Co., Ltd., product name: KBE-903); unsaturated group-containing silane coupling agents such as vinyltrimethoxysilane (manufactured by Shin-Etsu Chemical Co., Ltd., product name: KBM-1003), vinyltriethoxysilane (manufactured by Shin-Etsu Chemical Co., Ltd., product name: KBE-1003), 3-methacryloxypropyltrimethoxysilane (manufactured by Shin-Etsu Chemical Co., Ltd., product name: KBM-503), 3-methacryloxypropyltriethoxysilane (manufactured by Shin-Etsu Chemical Co., Ltd., product name: KBE-503), and p-styryltrimethoxysilane (manufactured by Shin-Etsu Chemical Co., Ltd., product name: KBM-1403); fluorine-atom-containing silane coupling agents such as trifluoropropyl trimethoxysilane (manufactured by Shin-Etsu Chemical Co., Ltd., product name: KBM-7103), and perfluoropolyether-containing trialkoxysilane (manufactured by Shin-Etsu Chemical Co., Ltd., product name: X-71-195, KY-1901, KY-108); glycidoxypropyltrimethoxysilane (manufactured by Shin-Etsu Chemical Co., Ltd., product name: KBM-403), glycidoxypropyltriethoxysilane (manufactured by Shin-Etsu Chemical Co., Ltd., product name: KBE-403), 3-mercaptopropyltrimethoxysilane (manufactured by Shin-Etsu Chemical Co., Ltd., product name: KBM-803), 3-isocyanatepropyltriethoxysilane (manufactured by Shin-Etsu Chemical Co., Ltd., product name: KBE-9007), and 3-trimethoxysilylpropyl succinic anhydride (manufactured by Shin-Etsu Chemical Co., Ltd., product name: X 967C); oligomers including the amino-based silane coupling agents and the unsaturated group-containing silane coupling agents; and the like. In particular, the amino-based silane coupling agents and the unsaturated group-containing silane coupling agents are more preferable.

The silane coupling agent is usually used as a diluted aqueous solution at a concentration of 0.1 mass % to 5 mass %, and it is particularly effective to use at 0.1 mass % to 1 mass %. By using such a surface-treated quartz glass cloth, the silane coupling agent adheres uniformly, and brings a more uniform protection effect to the glass cloth surface so that handling becomes easy. Moreover, uniform application without unevenness to resin that is used when fabricating prepreg becomes possible.

[Organic Resin]

The organic resin used in the low dielectric substrate for high-speed millimeter-wave communication is not particularly limited as long as the organic resin has a dielectric loss tangent within a range of 80% to 150% of the dielectric loss tangent of the quartz glass cloth at 10 GHz and a dielectric constant within a range of 50% to 110% of the dielectric constant of the quartz glass cloth at 10 GHz. For example, any thermosetting or thermoplastic organic resin having low dielectric characteristics, having a dielectric constant of 2.0 to 4.0 at 10 GHz and a dielectric loss tangent of 0.0020 or less, preferably 0.0015 or less at 10 GHz may be used. In addition, the resins may be mixed and used in combination.

Typical examples of the thermoplastic resin include polyphenylene ether, polyether ether ketone, polyether ketone, polyether sulfone, and fluorine resin (fluorine-based resin). In particular, fluorine resin is preferable because of low dielectric characteristics. As the fluorine resin, at least one selected from the group consisting of polytetrafluoroethylene [PTFE], polychlorotrifluoroethylene [PCTFE], ethylene (Et)-TFE copolymer [ETFE], Et-chlorotrifluoroethylene (CTFE) copolymer [ECTFE], CTFE-TFE copolymer, TFE-HFP copolymer [FEP], TFE-PAVE copolymer [PFA], and polyvinylidene fluoride [PVdF] is preferable. In particular, polytetrafluoroethylene [PTFE], TFE-HFP copolymer [FEP], and TFE-PAVE copolymer [PFA] are desirable in view of dielectric loss tangent. Incidentally, homopolymers and copolymers of tetrafluoroethylene (TFE) are also collectively called polytetrafluoroethylene derivatives.

Examples of the thermosetting resin include epoxy resin, allylated epoxy resin, maleimide resin, bismaleimide resin, cyanate resin, and cyclopentadiene-styrene copolymer resin. In particular, a bismaleimide resin represented by the following general formula (1) is used as an organic resin suitable for achieving low dielectricity.

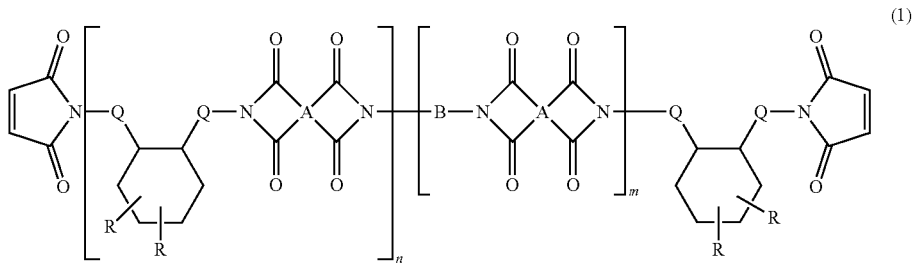

(1)

In the formula, A independently represents a tetravalent organic group including an aromatic ring or an aliphatic ring. B represents an alkylene chain having 6 to 18 carbon atoms and having an aliphatic ring that may contain a divalent heteroatom. Q independently represents a linear alkylene group having 6 or more carbon atoms. R independently represents a linear or branched alkyl group having 6 or more carbon atoms. "n" represents a number of 1 to 10. "m" represents a number of 0 to 10.

Typical bismaleimide resins include SLK-series (SLK-6895, SLK-3000, SLK-2600, etc. manufactured by Shin-Etsu Chemical Co., Ltd.). In addition, a thermosetting cyclopentadiene-styrene copolymer resin can also be used as a high heat resistance/low dielectric resin. Typical examples include the SLK-250 series (manufactured by Shin-Etsu Chemical Co., Ltd.).

In the present invention, the organic resin preferably has a dielectric loss tangent of 0.0001 to 0.0020 at 10 GHz and a dielectric constant of 2.0 to 4.0 at 10 GHz.

Such an organic resin is suitable for achieving low dielectricity in a substrate, and allows further reduction of transmission loss by reducing the difference in dielectric loss tangent between members even more.

In addition, a fluorine-based resin is preferable as the organic resin since low dielectric characteristics are excellent. In this case, the fluorine-based resin is preferably a polytetrafluoroethylene derivative, and the low dielectric substrate for high-speed millimeter-wave communication preferably has a dielectric loss tangent of 0.0001 to 0.0005 at 10 GHz and a dielectric constant of 2.2 to 3.7 at 10 GHz.

With such a substrate, it is possible to achieve an ideal substrate that is particularly excellent in low dielectric characteristics and has very little transmission loss or skew in high-speed communication using millimeter waves or the like.

[Silica Powder]

The inventive low dielectric substrate for high-speed millimeter-wave communication may contain an inorganic powder as necessary. Silica powder, which is a typical inorganic powder, functions as a reinforcement of a substrate by being added to the resin, and is a material that has a small expansion coefficient and that is excellent in insulation and dielectric characteristics. Therefore, a silica powder is preferably used as the inorganic powder.

The inventive low dielectric substrate for high-speed millimeter-wave communication may further contain a silica powder having an average particle size of 30 μm or less. Thus, the expansion coefficient, modulus of elasticity, and so forth of the substrate can be adjusted. The average particle size is preferably 0.1 to 30 μm.

The silica powder may contain, inside and on a part of the surface or the entire surface thereof, 200 ppm or less of a metal and/or an oxide thereof in terms of metal, the metal selected from aluminum, magnesium, and titanium, and the contained amounts of alkali metal and alkaline earth metal may be 10 ppm or less each. Furthermore, the above-described silica powder with 1 ppm or less of B, 1 ppm or less of P, and U and Th contents of 0.1 ppb or less each can also be used as a low dielectric silica powder.

Note that in the present invention, the maximum particle size and the average particle size can be measured by a laser diffraction type particle size distribution measurement apparatus (for example, SALD-3100 manufactured by Shimadzu Co., etc.), and the average particle size can be determined as a mass-average value D50 (that is, a median diameter or a particle size when a cumulative mass is 50%) in the particle size distribution measurement by a laser diffraction method.

[Low Dielectric Silica Powder]

In the present invention, a silica powder having a low value of dielectric loss tangent (low dielectric silica powder) is particularly preferably used from the viewpoint of achieving low dielectricity.

The silica powder used in the present invention preferably has a dielectric loss tangent of 0.0001 to 0.0015 at 10 GHz and a dielectric constant of 3.0 to 3.8 at 10 GHz.

When the low dielectric substrate for high-speed millimeter-wave communication contains such a silica powder, the silica powder to be loaded itself also has a low dielectric loss tangent, so that the dielectric characteristics can be remarkably improved while adjusting the expansion coefficient, modulus of elasticity, etc. of the substrate. Moreover, the difference in dielectric loss tangent depending on the members can be further reduced to lower the transmission loss further. The average particle size is preferably 0.1 to 30 μm.

Low dielectric silica powder that can be used in the present invention is preferably low dielectric silica powder which is provided with low dielectricity by heat-treating a silica powder at a temperature of 500° C. to 1500° C., and more preferably low dielectric silica powder which further has the surface of the heat-treated silica powder etched with a basic aqueous solution, further preferably with alkaline electrolyzed water having a pH of 12 or higher.

A silica powder that is preferable in the present invention has a hydroxy group (Si—OH) content of 300 ppm or less, and when the content is as described, a sufficiently low dielectric loss tangent can be achieved. By the above-described heat treatment, the hydroxy group amount contained in the silica powder becomes 300 ppm or less, preferably 280 ppm or less, further preferably 150 ppm or less, and a low dielectric silica powder having characteristics of a low dielectric loss tangent is achieved.

A low dielectric silica powder used in the present invention is a silica powder that has an average particle size of 0.1 to 30 μm, preferably a maximum particle size of 100 μm or less, and when used as a filler of a substrate for high-speed communication, an average particle size of 0.1 to 5 μm and a maximum particle size of 20 μm, more preferably an average particle size of 0.1 to 3 μm and a maximum particle size of 10 μm or less.

The low dielectric silica powder is provided with a dielectric constant of 3.0 to 3.8 and a dielectric loss tangent of 0.0001 to 0.0015, preferably 0.0001 to 0.0010, more preferably 0.0001 to 0.0005 at 10 GHz by heat-treating at a temperature of 500° C. to 1500° C.

When a silica powder is heat-treated at a temperature of 500° C. or higher, a strained layer is sometimes formed on the particle surface and strength is degraded. Therefore, as a low dielectric silica powder to be used in the present invention, a silica powder with this strained layer removed is preferably used. Regarding the removal of the strained layer of the silica powder, the strained layer can be easily removed by immersing the silica powder in an etching solution or the like in the same manner as the above quartz glass cloth is done.

Furthermore, by coating the surface of the silica powder with a silane coupling agent, the adhesion between resin and the surface of the quartz glass cloth and silica powder can be made strong when manufacturing prepreg.

As the silane coupling agent, a known silane coupling agent used for the quartz glass cloth described above can be used.

In particular, when a resin having a low dielectric constant and a low dielectric loss tangent is used as a matrix resin of the substrate, the difference in dielectric characteristics from the quartz glass cloth becomes great since the basket holes of the quartz glass cloth (the space between the weft and the warp of the glass cloth) are filled only with the resin. Therefore, the dielectric constant is preferably brought close to that of the quartz glass cloth by adding a silica powder. The amount of the silica powder can be 0 to 1000 parts by mass, preferably 50 to 800 parts by mass, particularly preferably 100 to 700 parts by mass based on a sum total of 100 parts by mass of the resin component. When the amount is 50 parts by mass or more, the dielectric characteristics can be adjusted sufficiently, the coefficient of thermal expansion (CTE) of the cured material does not become too large, and sufficient strength can be achieved. Therefore, 50 parts by mass or more is preferably added. However, the resin may be used without addition of a silica powder depending on the type or usage of the organic resin. When the amount is 1000 parts by mass or less, loss of flexibility or poor appearance do not occur when manufacturing prepreg. Note that this silica powder is preferably contained within the range of 10 to 90 mass %, in particular, 15 to 85 mass % of the total resin. The silica powder can have silica powders of different average particle sizes blended in order to enhance properties such as flowability and workability. Since basket holes are to be filled, the silica powder contained in the organic resin preferably has the above-described average particle size of 0.1 to 5 μm with a maximum particle size of 20 μm, more preferably an average particle size of 0.1 to 3 μm with a maximum particle size of 10 μm or less.

This low dielectric silica powder is suitable as a filler for substrates such as high-speed communication substrates and antenna substrates when used in combination with the above-described quartz glass cloth, especially low dielectric quartz glass cloth.

[Other Components]

The inventive low dielectric substrate may contain the above-described silane coupling agent and, according to necessity, optional components such as a dye, a pigment, a flame retardant, or an adhesive aid in addition to the above-described components.

—Low Dielectric Substrate for High-Speed Millimeter-Wave Communication—

The inventive low dielectric substrate for high-speed millimeter-wave communication may be a laminate substrate of an organic resin prepreg containing the above-described quartz glass cloth and organic resin as essential components, and may contain a silica powder as an optional component. In the inventive low dielectric substrate for high-speed millimeter-wave communication (organic resin laminate substrate), the thickness of an insulating layer can be selected appropriately depending on usage and so forth of the inventive low dielectric substrate for high-speed millimeter-wave communication, and is not particularly limited, but is preferably 20 to 2,000 µm, more preferably 50 to 1,000 µm.

The inventive low dielectric substrate for high-speed millimeter-wave communication is not particularly limited as long as the low dielectric substrate for high-speed millimeter-wave communication contains a quartz glass cloth and an organic resin, where the quartz glass cloth has a dielectric loss tangent of 0.0001 to 0.0015 at 10 GHz and a dielectric constant of 3.0 to 3.8 at 10 GHz, and the organic resin has a dielectric loss tangent within a range of 80% to 150% of the dielectric loss tangent of the quartz glass cloth at 10 GHz and a dielectric constant within a range of 50% to 110% of the dielectric constant of the quartz glass cloth at 10 GHz. Examples thereof include the following two types.

(1) A resin substrate obtained by: selecting a quartz glass cloth having the low dielectric characteristics and an organic resin having a dielectric loss tangent within a range of 80% to 150% of the dielectric loss tangent of the quartz glass cloth at 10 GHz and also having a dielectric constant within a range of 50% to 110% of the dielectric constant of the quartz glass cloth at 10 GHz; preparing a prepreg by impregnating the quartz glass cloth with the organic resin; and heating the prepreg containing the quartz glass cloth under pressure.

(2) A resin substrate obtained by: preparing a prepreg by impregnating the quartz glass cloth with an organic resin further containing a low dielectric silica powder; and heating the prepreg containing the quartz glass cloth under pressure.

The low dielectric substrate for high-speed millimeter-wave communication preferably has a dielectric loss tangent of 0.0001 to 0.0015 at 10 GHz and a dielectric constant of 2.0 to 3.8 at 10 GHz.

Such a low dielectric substrate for high-speed millimeter-wave communication is suitable for use in high-speed communication such as 5G.

—Method for Manufacturing Low Dielectric Substrate for High-Speed Millimeter-Wave Communication—

Methods for manufacturing the inventive low dielectric substrate for high-speed millimeter-wave communication are not particularly limited, but the inventive low dielectric substrate can be obtained, for example, in the following manner.

—Method for Manufacturing Organic Resin Prepreg—

Methods for fabricating a prepreg by impregnating a quartz glass cloth with an organic resin are not particularly limited. In addition, cases where an inorganic powder such as a silica powder is further used are not particularly limited either.

An organic resin (an organic resin composition containing or not containing a silica powder) having the above-described low dielectric characteristics is dissolved/dispersed in a solvent, and a quartz glass cloth is impregnated with the organic resin in this state. Next, the solvent is removed from the impregnated quartz glass cloth by evaporation to give a prepreg. A low dielectric substrate can be obtained by heat-curing the obtained prepreg under pressure. Here, there is preferably 1000 parts by mass or less (0 to 1000 parts by mass), more preferably 50 to 800 parts by mass of the silica powder per 100 parts by mass of the organic resin.

For example, when using an aqueous solution of polytetrafluoroethylene (PTFE), a silica powder is mixed in the aqueous solution in advance in a predetermined amount to obtain a slurry, and then the quartz glass cloth is impregnated and dried. Thus, a quartz glass cloth-containing prepreg containing a fluorine resin and a silica powder is obtained.

Pressure is applied to the quartz glass cloth-containing prepreg obtained here at a predetermined temperature for a predetermined time to fabricate a low dielectric substrate containing a fluorine resin. In a system of an aqueous solution of a fluorine resin fine powder, an organic surfactant and the like are contained, and therefore, the surfactant is preferably removed by heating at 300 to 400° C. for 5 minutes to 1 hour. The temperature/time/pressure conditions when fabricating the low dielectric substrate containing a fluorine resin can be the conditions for fabricating the metal-clad laminate substrate described below.

—Solvent—

When manufacturing the inventive low dielectric substrate for high-speed millimeter-wave communication, the solvent is not particularly limited as long as the solvent can dissolve/disperse the above-described low dielectric resin composition, and the solvent can be made to evaporate at a temperature at which the composition can be maintained in an uncured or semi-cured state. Examples include solvents with a boiling point of 50 to 200° C., preferably 80 to 150° C. Specific examples of the solvent include: hydrocarbonic non-polar solvents such as toluene, xylene, hexane, and heptane; and hydrocarbonic polar solvents such as ethers and esters. When using an organic resin that is difficult to dissolve, it is possible to also be used as an aqueous dispersion with a surfactant and water. The amount of solvent to be used is not particularly limited as long as the above-described organic resin composition can be in a dissolved or dispersed state and the quartz glass cloth can be impregnated with the obtained solution or dispersion with the amount. The amount of solvent is preferably 10 to 200 parts by mass, more preferably 20 to 100 parts by mass relative to 100 parts by mass of the organic resin composition.

The above-described solution or dispersion of the organic resin composition provides an organic resin prepreg. For example, the quartz glass cloth is impregnated with the solution or dispersion, and the solvent is removed in a drying furnace preferably at 50 to 150° C., more preferably at 60 to 120° C. When an aqueous dispersion is used, the prepreg is preferably further heated at 300 to 400° C. for 5 minutes to 1 hour in order to remove the surfactant.

—Metal-Clad Laminate Substrate—

The low dielectric substrate for high-speed millimeter-wave communication can also be a laminate substrate using an organic resin prepreg that contains the above-described low dielectric quartz glass cloth and organic resin having low dielectric characteristics as essential components and that may also contain a silica powder as an optional component. In such an organic resin laminate substrate, the thickness of the insulating layer can be appropriately selected in accordance with the usage of the substrate, etc.

and is not particularly limited. However, the thickness is preferably 20 to 2,000 μm, more preferably 50 to 1,000 μm.

Examples of such an organic resin laminate substrate include metal-clad laminate substrates.

A metal-clad laminate substrate using an organic resin prepreg that includes the above-described low dielectric quartz glass cloth and organic resin having low dielectric characteristics as essential components and that may include a silica powder as an optional component can be manufactured in the following manner.

Firstly, a prepreg is prepared in the same manner as a low dielectric substrate for high-speed millimeter-wave communication.

The obtained prepreg can be superimposed so that the number of superimposed prepregs is in accordance with the thickness of the insulating layer, and this can be heated under pressure to obtain a laminate substrate. A metal foil is superimposed on the prepreg, and is heated under pressure by using a vacuum press or the like at a pressure of 5 to 50 MPa and a temperature of 70 to 400° C. to manufacture a metal-clad laminate substrate. The metal foil is not particularly limited, but a copper foil is preferably used in view of electricity and economy. Processing this metal-clad laminate substrate by normally used methods such as a subtractive method and drilling can provide a printed circuit board.

In the case of a thermoplastic resin which is difficult to dissolve in a solvent, a prepreg can also be fabricated by thermocompression-bonding a thin resin film, a copper foil, and a quartz glass cloth.

For example, when fabricating a fluorine resin substrate, there is a method of compressing an already molded and surface-treated fluorine resin film, a glass cloth, and a copper foil under heating. Thermocompression-bonding under heating can normally be performed at 250 to 400° C. for 1 to 20 minutes under a pressure of 0.1 to 10 MPa. Regarding the thermocompression-bonding temperature, there are concerns for seeping of resin and loss of uniformity in thickness occurring when the temperature is high, although this depends on the softening temperature of the fluorine resin, and the temperature is preferably lower than 340° C., and more preferably 330° C. or lower. Thermocompression-bonding can also be performed in batches by using a press, and can also be performed continuously by using a high-temperature laminator. When a press is used, a vacuum press is preferably used in order to prevent sandwiching of air and to make it easier for the fluorine resin to get inside the glass cloth.

By the above manufacturing method, a fluorine resin substrate, which is a starting material of the present invention, can be fabricated.

A fluorine resin film subjected to a surface treatment cannot adhere sufficiently to a copper foil with low surface roughness on its own, and seeps from the copper foil during thermocompression-bonding, and thickness cannot be made uniform either. However, as described above, when compounded with a glass cloth, linear expansion coefficient becomes sufficiently lowered, furthermore, seeping of the resin is also reduced, and high adhesion is exhibited even with a copper foil with a surface roughness Ra of less than 0.2 μm.

The structure of the laminate includes two sheets of copper foil and in between, "n" sheets of fluorine resin film and "n−1" sheets of glass cloth laminated alternately ("n" is an integer of 2 to 10). The value of "n" is preferably 8 or less, and further preferably 6 or less. By changing the thickness of the fluorine resin film, the type of the quartz glass cloth, and the value of "n", the linear expansion coefficient of the resin laminate substrate of the present invention in X and Y directions is variable. The value of the linear expansion coefficient is preferably within the range of 5 to 50 ppm/° C., further preferably 10 to 40 ppm/° C. When the linear expansion coefficient of the dielectric layer is 50 ppm/° C. or less, the adhesiveness between the copper foil and the dielectric layer does not become low, and faults such as warping and waviness of the substrate after etching the copper foil do not occur.

An electrode pattern of the metal-clad laminate substrate can be formed by a known method, for example by etching a copper-clad laminate substrate having a low dielectric resin laminate substrate of the present invention and a copper foil provided on one or both sides of the laminate substrate.

As described, the present inventors have found out the following to manufacture a substrate for high-speed millimeter-wave communication. A quartz glass cloth is obtained by heat-treating a quartz glass cloth having the lowest dielectric constant at a high temperature, then removing the strained layer on the surface of the quartz fibers configuring the cloth to adjust the dielectric loss tangent in a high frequency region to less than 0.0015, the intrinsic level of quartz, and adjust tensile strength to 2.1 N/25 mm or more per cloth weight (g/m$^2$). When the low dielectric resin in the basket holes of the quartz glass cloth has a dielectric constant that is remarkably smaller than that of the quartz glass cloth, a low dielectric resin is mixed with a silica powder with an average particle size of 30 μm or less, having a dielectric constant adjusted to 3.5 to 3.9 and a dielectric loss tangent adjusted to less than 0.0015 at 10 GHz in order to bring the dielectric constant of the low dielectric resin close to the dielectric constant of the quartz glass cloth. By adjusting the difference in the dielectric constants of the quartz glass cloth, the low dielectric resin, and the silica powder within the range of −50% to +10% and the difference in the dielectric loss tangents within the range of −20% to +50%, it is possible to manufacture a low dielectric substrate having remarkably improved dielectric characteristics and little variation within the substrate. Desirably, the difference between the components in dielectric loss tangent is within −20% to +20%, more desirably within −10% to +10%. The thinner the thickness of the low dielectric substrate, the closer the dielectric loss tangents of the components need to be.

The inventive low dielectric substrate for high-speed millimeter-wave communication includes a quartz glass cloth and a low dielectric resin, and a silica powder added as necessary. Such a low dielectric substrate has a small difference in dielectric characteristics between the resin, glass cloth, and so forth above and below the wirings even when seen on a microscopic scale. Therefore, even when the substrate has an uneven distribution of the resin or glass cloth around the wirings, it is possible to send stable signals with excellent quality and no difference in propagation time between wirings. In addition, the low dielectric substrate has a dielectric loss tangent with little variation and difference in dielectric loss tangent characteristics between the various members. Furthermore, the inventive low dielectric substrate for high-speed millimeter-wave communication is also useful as a circuit board material for a multilayer printed substrate or the like having a low dielectric constant and a low dielectric loss tangent and also excellent in transmission properties of high-frequency signals.

EXAMPLE

Hereinafter, the present invention will be specifically described with reference to Examples and Comparative Examples. However, the present invention is not limited thereto.

Note that the characteristic values (tensile strength, dielectric loss tangent (tan δ), dielectric constant, and average particle size) in the following were measured by the following methods unless otherwise indicated.

1. Measurement of Tensile Strength

Tensile strength was measured in accordance with "7.4 tensile strength" of "Testing methods for textile glass products" of JIS R3420: 2013.

2. Measurement of Dielectric Loss Tangent 2.1 Glass Cloth, Organic Resin, and Resin Substrate Unless otherwise stated in particular, the dielectric loss tangent of a sample at a frequency of 10 GHz was measured by connecting a network analyzer (E5063A manufactured by Keysight Technologies) to an SPDR resonator.

2.2 Silica Powder (1) 100 parts by mass of a silica powder was mixed in 100 parts by mass of an anisole solvent containing 100 parts by mass of SLK-3000 (manufactured by Shin-Etsu Chemical Co., Ltd.), being a low dielectric maleimide resin and as a curing agent, 2.0 parts by mass of dicumyl peroxide (Percumyl D manufactured by NOF Corporation), being a radical polymerization initiator. This was dispersed and dissolved to prepare a varnish. At this time, the silica powder is 33.3% relative to the resin by volume %. In the same manner, the silica powder was blended so as to be 0%, 11.1%, and 66.7% relative to 100 parts by mass of the resin by volume %, and varnish was fabricated.

The fabricated varnish was spread to a thickness of 200 μm with a bar coater, and placed in a dryer at 80° C. for 30 minutes to remove the anisole solvent. Thus, an uncured maleimide resin composition was prepared.

(2) Each uncured maleimide resin composition prepared was placed in a mold of 60 mm×60 mm×100 μm, cured in a handpress at 180° C. for 10 minutes at 30 MPa, and then completely cured in a dryer at 180° C. in 1 hour to fabricate a cured resin sheet. The cured resin sheet was cut to a size of 50 mm×50 mm, and the dielectric loss tangent at 10 GHz was measured using SPDR (Split post dielectric resonators) for measuring dielectric constant with dielectric resonator at a frequency of 10 GHz (manufactured by Keysight Technologies).

(3) A line of the volume % of the silica powder against the dielectric loss tangent was made from the plot obtained by plotting the values of the given dielectric loss tangent with the volume % of the silica powder on the horizontal axis and the measured dielectric loss tangent on the vertical axis. This line was extrapolated, and the dielectric loss tangent at 100% silica powder was taken as the value of the dielectric loss tangent of silica powder.

Note that there is a measuring apparatus that is said to be able to measure silica powder directly, but such an apparatus has difficulty getting rid of the air that is mixed in due to measurement performed with the silica powder loaded in a measurement pot. In particular, measurement is even more difficult with silica powder having a large specific surface area since the mixed air has a great influence. Accordingly, in order to eliminate the influence of the mixed-in air and obtain a value in a state close to the mode for actual use, the dielectric loss tangent of the silica powder was determined by the above-described measuring method in the present invention.

3. Measurement of Dielectric Constant

Regarding glass cloth, organic resin, and resin substrate, the dielectric constant of a sample at a frequency of 10 GHz was measured by connecting a network analyzer (E5063A manufactured by Keysight Technologies) to an SPDR resonator unless otherwise stated in particular.

Regarding silica powder, the dielectric constant was measured together with the dielectric loss tangent.

4. Measurement of Average Particle Size

The average particle size was measured with a laser diffraction type particle size distribution measurement apparatus, and the mass-average value D50 in the particle size distribution was taken as the average particle size.

<Manufacturing Low Dielectric Quartz Glass Cloth>

Preparation Example 1: Production Example of Quartz Glass Cloth (SG1)

While extending a quartz glass thread at a high temperature, a sizing agent for quartz glass fiber was applied to fabricate a quartz glass strand from 200 quartz glass filaments with a diameter of 7.0 μm. Next, the obtained quartz glass strand was twisted by 0.2 times per 25 mm to fabricate a quartz glass yarn.

The obtained quartz glass yarn was set in an air jet loom, and a quartz glass cloth was weaved with a plain weave with a warp count (density) of 60/25 mm, and a weft count of 58/25 mm. The quartz glass cloth had a thickness of 0.086 mm and a cloth weight of 85.5 g/m².

The sizing agent for fiber was removed by heat-treating this quartz glass cloth at 400° C. for 10 hours. The quartz glass cloth with a width of 1.3 m and a length of 2000 m manufactured in Preparation Example 1 was named SG1. The dielectric constant of SG1 at a frequency of 10 GHz was 3.6, the dielectric loss tangent was 0.0011, and the tensile strength 80 N/25 mm.

Preparation Example 2: Production Example of (SG2)

The quartz glass cloth with the width of 1.3 m and the length of 2000 m manufactured in Preparation Example 1 was placed in an electric furnace set to 700° C. and heated for 5 hours. After heating, the quartz glass cloth was cooled to room temperature over 8 hours.

Subsequently, the quartz glass cloth was placed in alkaline electrolyzed water with a pH of 13 heated to 40° C., and was immersed for 48 hours to perform an etching treatment. After etching, an etched quartz glass cloth was washed with ion-exchanged water and dried to fabricate a quartz glass cloth (SG2) with low dielectricity and high strength. The dielectric constant of the quartz glass cloth SG2 was 3.3, the dielectric loss tangent was 0.0002, and the tensile strength was 105 N/25 mm.

(Metal Impurities Contained in Quartz Glass Cloth Manufactured in Preparation Example 1 to 2 and Treatment with Silane Coupling Agent)

The amount of alkali metal in the quartz glass cloth was 0.5 ppm in both SG1 and SG2, P (phosphorus) content was 0.1 ppm, and U and Th contents were 0.1 ppb each. The content of each element was measured by an atomic absorption method (in terms of mass).

The quartz glass cloths SG1 and SG2 were immersed in a 0.5 mass % silane coupling agent KBM-903 (product name; 3-aminopropyltrimethoxysilane manufactured by Shin-Etsu Chemical Co., Ltd.) aqueous solution for 10 minutes, and were subsequently heated and dried at 110° C. for 20 minutes for surface treatment.

The properties of the prepared quartz glass cloths are shown in Table 1.

Preparation Examples 3 to 6: Production Example of Quartz Glass Cloth (SG3 to SG6)

Table 1 shows the properties of quartz glass cloths prepared by performing a heat treatment, etching treatment, and CF (carbon functional) silane treatment in the same manner as in Preparation Example 2 except that the heating temperature and the heating time of SG2 in the electric furnace was altered.

TABLE 1

|  | Preparation Example | | | | | |
| --- | --- | --- | --- | --- | --- | --- |
|  | 1 | 2 | 3 | 4 | 5 | 6 |
| Quartz glass cloth No. | SG1 | SG2 | SG3 | SG4 | SG5 | SG6 |
| Heating temperature (° C.) | 400 | 700 | 700 | 900 | 1100 | 1100 |
| Heating time (h) | 10 | 5 | 2 | 3 | 1 | 10 |
| Dielectric loss tangent at 10 GHz | 0.0011 | 0.0002 | 0.0008 | 0.0002 | 0.0002 | 0.0002 |
| Dielectric constant at 10 GHz | 3.6 | 3.3 | 3.4 | 3.3 | 3.3 | 3.2 |
| Heat treatment *1 | − | + | + | + | + | + |
| Etching treatment *2 | − | + | + | + | + | + |
| CF silane treatment *3 | + | + | + | + | + | + |

*1: Heating at 500° C. or higher, heat treatment performed: +, treatment not performed: −
*2: Alkaline electrolyzed water, etching treatment performed: +, treatment not performed: −
*3: KBM-903, treatment performed: +

<Manufacturing Low Dielectric Silica Powder>

Preparation Example 7

5 Kg of silica (SO-E5 manufactured by ADMATECHS) with an average particle size of 1.5 μm and a dielectric loss tangent of 0.0011 at 10 GHz was placed in an alumina container and heated in a muffle furnace (manufactured by AS ONE Corporation) in the air at 900° C. for 12 hours, and then cooled to room temperature over 6 hours to obtain heat-treated silica. The heat-treated silica was placed in a plastic container containing 20 liters of alkaline electrolyzed water with a pH of 13 and stirred for 2 hours while heating at 60° C. to remove a strained layer on the silica powder surface. Subsequently, etched silica was separated with a centrifugal separator, then washed with methanol, and dried. The dried silica was disintegrated with a ball mill to give the silica. This had a dielectric constant of 3.3 and a dielectric loss tangent of 0.0002 at 10 GHz. The obtained low dielectric silica powder (SP1) was subjected to a surface treatment with a silane coupling agent KBM-503 (3-methacryloxypropyltrimethoxysilane manufactured by Shin-Etsu Chemical Co., Ltd.), and this was used to manufacture a resin substrate.

TABLE 2

| Preparation Example | 7 | — |
| --- | --- | --- |
| Treated silica No. | SP1 | SO-E5 |
| Heating temperature (° C.) | 900 | — |
| Heating time (h) | 12 | — |
| Dielectric loss tangent at 10 GHz | 0.0002 | 0.0011 |
| Dielectric constant at 10 GHz | 3.3 | 3.8 |

TABLE 2-continued

| Preparation Example | 7 | — |
| --- | --- | --- |
| Heat treatment *1 | + | − |
| Etching treatment *2 | + | − |
| CF silane treatment *3 | + | + |

*1: Heating at 500° C. or higher, heat treatment performed: +, treatment not performed: −
*2: Alkaline electrolyzed water, etching treatment performed: +, treatment not performed: −
*3: KBM-503, treatment performed: +

[Example 1] Fluorine Resin Prepreg and Laminate Substrate

The quartz glass cloth (SG2) shown in Preparation Example 2 was impregnated and coated with a polytetrafluoroethylene fine particle aqueous dispersion (PTFE aqueous dispersion) containing 60 mass % of polytetrafluoroethylene (PTFE) fine particles having a dielectric loss tangent of 0.0002 at 10 GHz, 6 mass % of a nonionic surfactant, and 34 mass % of water, making adjustments so that the adhered amount of PTFE on SG2 was 46 mass %. Subsequently, the water was eliminated by drying for 10 minutes in a drying furnace at 100° C. Next, the fabricated prepreg was molded with a vacuum decompression press at 380° C. and 1.5 MPa for 5 minutes. The molded prepreg was further left to stand in a dryer at 380° C. for 5 minutes to fabricate a fluorine resin substrate.

A network analyzer (E5063A manufactured by Keysight Technologies) and an SPDR resonator were connected, and the dielectric loss tangent and dielectric constant of the fabricated fluorine resin substrate at a frequency of 10 GHz were measured.

The fluorine resin substrate had no molding defects, and a favorable fluorine resin substrate was obtained. The fluorine resin substrate had excellent dielectric characteristics at 10 GHz: a dielectric loss tangent of 0.0002; and a dielectric constant of 3.3. Table 3 shows the results.

Comparative Example 1

In the same manner as in Example 1, the quartz glass cloth (SG1) of Preparation Example 1 was impregnated and coated with the PTFE aqueous dispersion, adjusting the adhered amount to 46 mass %, then was dried and molded under pressure and heat in the same manner as in Example 1, and was further heated to fabricate a fluorine resin substrate.

A network analyzer (E5063A manufactured by Keysight Technologies) and an SPDR resonator were connected, and the dielectric loss tangent and dielectric constant of the fabricated fluorine resin substrate at a frequency of 10 GHz were measured. Table 3 shows the results.

The fluorine resin substrate had no molding defects, and a favorable fluorine resin substrate was obtained. The fluorine resin substrate had a dielectric loss tangent of 0.0007 and a dielectric constant of 3.5 at 10 GHz. The values show low dielectricity in bulk, but when seen on a microscopic scale, the dielectric loss tangent has deviated in the polytetrafluoroethylene and quartz glass cloth portions. Therefore, there is a difference in dielectric loss tangent between portions mainly containing fluorine resin and portions mainly containing glass cloth so that a large variation in skew becomes a problem in communication using high-frequency of millimeter waves or higher as described below.

TABLE 3

| Example/Comparative Example | Example 1 | Comparative Example 1 |
|---|---|---|
| Preparation Example | 2 | 1 |
| Quartz glass cloth No. | SG2 | SG1 |
| Dielectric loss tangent of quartz glass cloth at 10 GHz | 0.0002 | 0.0011 |
| Dielectric constant of quartz glass cloth at 10 GHz | 3.3 | 3.6 |
| Dielectric loss tangent of low dielectric resin at 10 GHz | 0.0002 | 0.0002 |
| Dielectric constant of low dielectric resin at 10 GHz | 2.1 | 2.1 |
| Dielectric loss tangent of substrate at 10 GHz | 0.0002 | 0.0007 |
| Dielectric constant of substrate at 10 GHz | 3.3 | 3.5 |
| Cut surface of substrate | good | good |
| Difference between members in dielectric loss tangent *1 | good | poor |
| Substrate uniformity *2 | good | poor |

*1 The difference in dielectric loss tangent was within the range of −20% to +50%: good outside the range of −20% to +50%: poor
*2 Substrate uniformity
The difference in dielectric loss tangent was within the range of −20% to +50%: good outside the range of −20% to +50%: poor

[Examples 2 and 3] Fluorine Resin Prepreg and Fluorine Resin Substrate

In the same manner as in Example 1, the quartz glass cloth (SG2) shown in Preparation Example 2 was impregnated and coated with a PTFE aqueous dispersion having a dielectric constant of 2.1 and a dielectric loss tangent of 0.0002 at 10 GHz, adjusting the adhered amount to 50 to 54 mass %. Then, the prepreg was dried and molded under pressure and heat in the same manner as in Example 1, and was further heated to fabricate a fluorine resin substrate.

A network analyzer (E5063A manufactured by Keysight Technologies) and an SPDR resonator were connected, and the dielectric loss tangent and dielectric constant of the fabricated fluorine resin substrate at a frequency of 10 GHz were measured. Table 4 shows the results.

[Comparative Examples 2 and 3] Fluorine Resin Prepreg and Fluorine Resin Substrate In the same manner as in Example 2, the quartz glass cloth (SG1) shown in Preparation Example 1 was impregnated and coated with a PTFE aqueous dispersion having a dielectric constant of 2.1 and a dielectric loss tangent of 0.0002 at 10 GHz, adjusting the adhered amount to 50 to 54 mass %. Then, the prepreg was dried and molded under pressure and heat in the same manner as in Example 2, and was further heated to fabricate a fluorine resin substrate.

A network analyzer (E5063A manufactured by Keysight Technologies) and an SPDR resonator were connected, and the dielectric loss tangent and dielectric constant of the fabricated fluorine resin substrate at a frequency of 10 GHz were measured. Table 4 shows the results.

TABLE 4

| | Example/Comparative Example | | | | | |
|---|---|---|---|---|---|---|
| | Example 1 | Example 2 | Example 3 | Comparative Example 1 | Comparative Example 2 | Comparative Example 3 |
| Quartz glass cloth No. | | SG2 | | | SG1 | |
| Dielectric loss tangent of quartz glass cloth at 10 GHz | | 0.0002 | | | 0.0011 | |
| Dielectric constant of quartz glass cloth at 10 GHz | | 3.3 | | | 3.6 | |
| PTFE dielectric loss tangent at 10 GHz | | | | | 0.0002 | |
| PTFE dielectric constant at 10 GHz | | | | | 2.1 | |

TABLE 4-continued

| | Example/Comparative Example | | | | | |
|---|---|---|---|---|---|---|
| | Example 1 | Example 2 | Example 3 | Comparative Example 1 | Comparative Example 2 | Comparative Example 3 |
| PTFE adhered amount (mass %) *1 | 46 | 50 | 54 | 46 | 50 | 54 |
| Dielectric loss tangent of substrate at 10 GHz | 0.0002 | 0.0002 | 0.0002 | 0.0007 | 0.0006 | 0.0005 |
| Dielectric constant of substrate at 10 GHz | 3.3 | 3.3 | 3.2 | 3.5 | 3.4 | 3.4 |

*1 The amount of loaded resin taking up the substrate

In a system in which the difference between the dielectric loss tangent of the quartz glass cloth and the dielectric loss tangent of the low dielectric resin (PTFE) was small (Examples 1 to 3), the dielectric loss tangent was similar even when the proportion of the quartz glass cloth and the resin in the substrate was different, and dielectric characteristics with no variation were exhibited. That is, it was proved that the dielectric loss tangent within the substrate was the same even when the amounts of the members were different.

On the other hand, in a system in which there was a large difference in dielectric loss tangent between the members (Comparative Examples 1 to 3), there was variation in the dielectric loss tangent depending on the proportion of the quartz glass cloth and the resin. That is, the substrate was uneven on a microscopic scale. In a substrate having a variation in dielectric characteristics between adjoining members in this manner, a difference in propagation delay time (skew) occurs between differential wirings when a wiring angle changes as described below. Therefore, there is a problem that the variation in skew value becomes large.

[Example 4] Fluorine Resin Prepreg and Fluorine Resin Substrate

Two tetrafluoroethylene-perfluoroalkylvinylether copolymer (PFA) films (TFE/PPVE=98.5/1.5 (mol %), MFR (melt flow rate): 14.8 g/10 minutes, melting point: 305° C.) having a thickness of 50 μm and having a dielectric constant of 2.1 and a dielectric loss tangent of 0.0008 at 10 GHz, and one sheet of the quartz glass cloth (SG3) shown in Preparation Example 3 were provided. They were laminated in the order PFA film/quartz glass cloth/PFA film. This was hot-pressed at 325° C. for 30 minutes by using a vacuum pressure press to fabricate a fluorine resin substrate.

The fluorine resin substrate had no molding defects, and a favorable fluorine resin substrate was obtained. The fluorine resin substrate had excellent characteristics: a dielectric loss tangent of 0.0008 at 10 GHz; and a dielectric constant of 3.4 at 10 GHz. Table 5 shows the results.

Examples 5 to 7, Comparative Examples 4 and 5

Using the quartz glass cloths (SG3 to 6) of Preparation Examples 3 to 6 in Table 1 instead of the quartz glass cloth (SG2) of Example 1, and using a PTFE aqueous dispersion as a fluorine resin, a fluorine resin substrate was fabricated in the same manner as in Example 1 (Examples 5 to 7, Comparative Example 4). Meanwhile, using the quartz glass cloth (SG2) of Preparation Example 2 instead of the quartz glass cloth (SG3) of Example 4, a fluorine resin substrate was fabricated in the same manner as in Example 4 (Comparative Example 5). The results are shown in Table 5, together with those of Example 1 and Comparative Example 1.

TABLE 5

| | Example | | | | | Comparative Example | | |
|---|---|---|---|---|---|---|---|---|
| | Example/Comparative Example | | | | | | | |
| | 1 | 4 | 5 | 6 | 7 | 1 | 4 | 5 |
| Quartz glass cloth Preparation Example | 2 | 3 | 4 | 5 | 6 | 1 | 3 | 2 |
| Quartz glass cloth No. | SG2 | SG3 | SG4 | SG5 | SG6 | SG1 | SG3 | SG2 |
| Dielectric loss tangent of quartz glass cloth at 10 GHz | 0.0002 | 0.0008 | 0.0002 | 0.0002 | 0.0002 | 0.0011 | 0.0008 | 0.0002 |
| Dielectric constant of quartz glass cloth at 10 GHz | 3.3 | 3.4 | 3.3 | 3.3 | 3.2 | 3.6 | 3.4 | 3.3 |
| Type of low dielectric resin | PTFE | PFA | PTFE | PTFE | PTFE | PTFE | PTFE | PFA |
| Dielectric loss tangent of low dielectric resin at 10 GHz | 0.0002 | 0.0008 | 0.0002 | 0.0002 | 0.0002 | 0.0002 | 0.0002 | 0.0008 |
| Dielectric constant of low dielectric resin at 10 GHz | 2.1 | 2.1 | 2.1 | 2.1 | 2.1 | 2.1 | 2.1 | 2.1 |
| Dielectric loss tangent of substrate at 10 GHz | 0.0002 | 0.0008 | 0.0002 | 0.0002 | 0.0002 | 0.0007 | 0.0006 | 0.0006 |

TABLE 5-continued

|  | Example | | | | | Comparative Example | | |
|---|---|---|---|---|---|---|---|---|
|  | Example/Comparative Example | | | | | | | |
|  | 1 | 4 | 5 | 6 | 7 | 1 | 4 | 5 |
| Dielectric constant of substrate at 10 GHz | 3.3 | 3.4 | 3.2 | 3.2 | 3.2 | 3.5 | 3.4 | 3.4 |
| Difference between members in dielectric loss tangent *1 | good | good | good | good | good | poor | poor | poor |
| Substrate uniformity *2 | good | good | good | good | good | poor | poor | poor |

*1 The difference in dielectric loss tangent was
within the range of −20% to +50%: good
outside the range of −20% to +50%: poor
*2 Substrate uniformity
The difference in dielectric loss tangent was
within the range of −20% to +50%: good
outside the range of −20% to +50%: poor As shown in Comparative Example 1, Comparative Example 4, and Comparative Example 5, the substrates in these Comparative Examples had a low dielectric loss tangent than in Example 4, and were better. However, since there was a difference between the members in dielectric loss tangent, there was a variation in dielectric loss tangent within the substrate. Accordingly, the large variation in the skew value becomes a problem in this case as well, and the substrates lack reliability even when the dielectric loss tangent is low in bulk as a substrate.

[Example 8, Comparative Examples 6 and 7]
Prepreg and Substrate Using SLK Series, which are Bismaleimide Resins (A) Cyclic Imide Compound
(A-1): linear alkylene group-containing maleimide compound (SLK-3000 manufactured by Shin-Etsu Chemical Co., Ltd.) represented by the following formula (2)

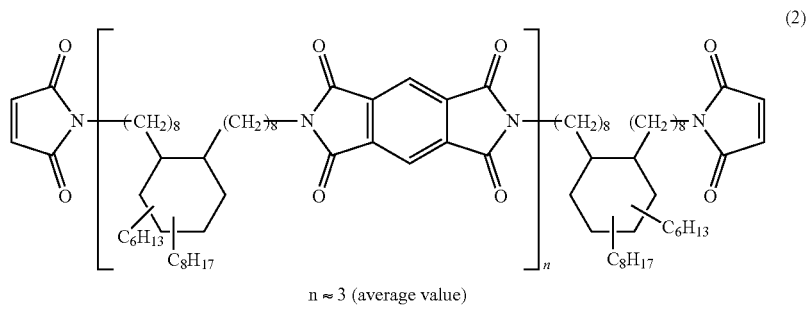

n ≈ 3 (average value)

(2)

(A-2): linear alkylene group-containing maleimide compound (SLK-2500 manufactured by Shin-Etsu Chemical Co., Ltd.) represented by the following formula (3)

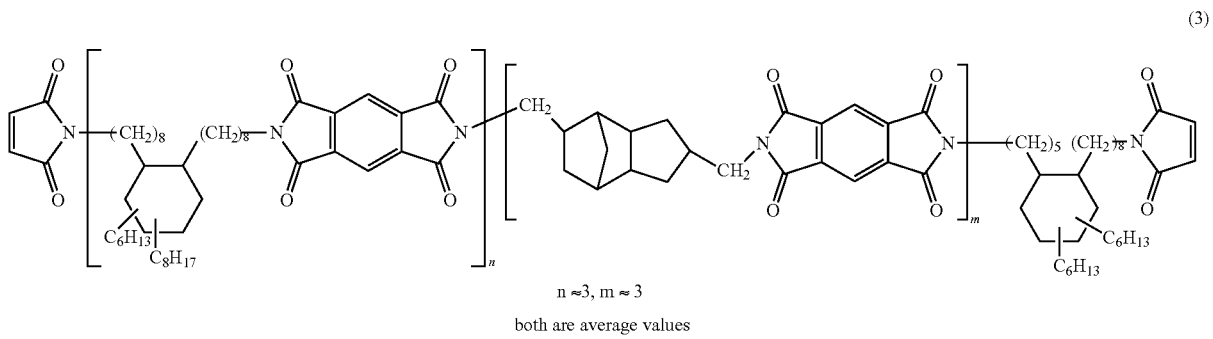

(3)

n ≈ 3, m ≈ 3
both are average values

<Preparation of Slurry>

Preparation Example 8

100 parts by mass of SLK-3000, 100 parts by mass of the low dielectric silica powder SP1 shown in Preparation Example 7, and 2 parts by mass of dicumyl peroxide (product name: Percumyl D, manufactured by NOF Corporation) were added into anisole as a solvent. This was premixed with a stirrer to fabricate a 60% slurry solution, and a cyclic imide slurry composition having a uniformly dispersed filler was prepared.

Preparation Example 9

100 parts by mass of SLK-3000, 100 parts by mass of SO-E5 manufactured by ADMATECHS as a silica powder, and 2 parts by mass of dicumyl peroxide (product name: Percumyl D, manufactured by NOF Corporation) were added into anisole as a solvent. This was premixed with a stirrer to fabricate a 60% slurry solution, and a cyclic imide slurry composition having an evenly dispersed filler was prepared.

Preparation Example 10

100 parts by mass of SLK-2500, 100 parts by mass of the low dielectric silica powder SP1 shown in Preparation Example 7, and 2 parts by mass of dicumyl peroxide (product name: Percumyl D, manufactured by NOF Corporation) were added into anisole as a solvent. This was premixed with a stirrer to fabricate a 60% slurry solution, and a cyclic imide slurry composition having an evenly dispersed filler was prepared.

<Fabrication of Prepreg and Resin Substrate>

The quartz glass cloths SG1 or SG2 was impregnated with one of the above compositions as shown in Table 6. Then, the resultant was dried at 120° C. for 5 minutes to fabricate a prepreg. In this event, the adhered amount was adjusted to be 46%. Subsequently, three sheets of the fabricated prepreg were laminated, and using a vacuum decompression press, this laminate was cured in steps: at 150° C. for 1 hour; and furthermore, at 180° C. for 2 hours. Thus, resin substrates were fabricated. Subsequently, a network analyzer (E5063A manufactured by Keysight Technologies) and an SPDR resonator were connected, and the dielectric constant and dielectric loss tangent of the cured resin substrates at a frequency of 10 GHz was measured. Table 6 shows the results.

TABLE 6

| Example & Comparative Example | Example 8 | Comparative Example 6 | Comparative Example 7 |
|---|---|---|---|
| Quartz glass cloth No. | SG1 | SG2 | SG2 |
| Dielectric loss tangent of quartz glass cloth at 10 GHz | 0.0011 | 0.0002 | 0.0002 |
| Dielectric constant of quartz glass cloth at 10 GHz | 3.6 | 3.3 | 3.3 |
| Type of maleimide resin | SLK3000 | SLK3000 | SLK2500 |
| Dielectric loss tangent of maleimide resin at 10 GHz | 0.0016 | 0.0016 | 0.0018 |
| Dielectric constant of maleimide resin at 10 GHz | 2.4 | 2.4 | 2.5 |
| Silica powder No. | SO-E5 | SP1 | SP1 |
| Dielectric loss tangent of silica powder at 10 GHz | 0.0011 | 0.0002 | 0.0002 |
| Dielectric constant of silica powder at 10 GHz | 3.8 | 3.3 | 3.3 |
| slurry Preparation Example | 9 | 8 | 10 |
| Dielectric loss tangent of substrate at 10 GHz | 0.0012 | 0.0004 | 0.0005 |
| Dielectric constant of substrate at 10 GHz | 3.6 | 3.4 | 3.4 |
| Cut surface of substrate | good | good | good |
| Difference between members in dielectric loss tangent *1 | good | poor | poor |
| Substrate uniformity *2 | good | poor | poor |

*1 The difference in dielectric loss tangent was within the range of −20% to + 50%: good outside the range of −20% to +50%: poor
*2 Substrate uniformity
The difference in dielectric loss tangent was within the range of −20% to +50%: good outside the range of −20% to +50%: poor In Example 8, the same maleimide resin is used as in Comparative Example 6, but since the blended silica powder has a large dielectric loss tangent, the substrate has a higher dielectric loss tangent than in Comparative Example 6. However, since the difference in dielectric loss tangent between the members (quartz glass cloth, resin, and silica powder) is small, there is no variation in dielectric loss tangent within the substrate, and the substrate has high reliability as a substrate.

On the other hand, in Comparative Examples 6 and 7, although the substrates have a low dielectric loss tangent with the maleimide resin, there is a variation in dielectric loss tangent within the substrate, and the substrate lacks reliability even if the dielectric loss tangent in the bulk is low as a substrate.

[Example 9] Silica-Containing Fluorine Resin Substrate

To 100 parts by mass of the PTFE aqueous dispersion of Example 1, 40 parts by mass of the low dielectric silica powder (SP1) fabricated in Preparation Example 7 was added and mixed to prepare a silica-containing PTFE dispersion. The quartz glass cloth (SG2) shown in Preparation Example 2 was impregnated and coated with this dispersion, adjusting the adhered amount to 46 mass %. Subsequently, the water was eliminated by drying in a drying furnace at 100° C. for 10 minutes. Next, the fabricated prepreg was molded with a vacuum decompression press at 380° C. and at 1.5 MPa for 5 minutes. The molded prepreg was further left to stand in a dryer at 380° C. for 5 minutes to fabricate a fluorine resin substrate.

A network analyzer (E5063A manufactured by Keysight Technologies) and an SPDR resonator were connected, and the dielectric loss tangent and dielectric constant of the fabricated fluorine resin substrate at a frequency of 10 GHz were measured. Table 7 shows the results.

The fluorine resin substrate had no molding defects, and a strong fluorine resin substrate having a small coefficient of thermal expansion was obtained. The substrate had excellent dielectric characteristics: a dielectric loss tangent of 0.0002 at 10 GHz; and a dielectric constant of 3.4 at 10 GHz. In addition, the substrate had no variation in dielectric loss tangent within the substrate.

[Comparative Example 8] Silica-Containing Fluorine Resin Substrate with Low Dielectric Glass Cloth To 100 parts by mass of the PTFE aqueous dispersion of Example 1, 40 parts by mass of the low dielectric silica powder (SP1) fabricated in Preparation Example 7 was added and mixed to prepare a silica-containing PTFE dispersion. A low dielectric LE glass cloth (LEG) having a dielectric constant of 4.4 and a dielectric loss tangent of 0.0020 at 10 GHz was impregnated and coated with this dispersion, adjusting the adhered amount to be 46 mass %. Subsequently, the water was eliminated by drying in a drying furnace at 100° C. for 10 minutes. Next, the fabricated prepreg was molded with a vacuum decompression press at 380° C. and at 1.5 MPa for 5 minutes. The molded prepreg was further left to stand in a dryer at 380° C. for 5 minutes to fabricate a fluorine resin substrate.

A network analyzer (E5063A manufactured by Keysight Technologies) and an SPDR resonator were connected, and the dielectric loss tangent and dielectric constant of the fabricated fluorine resin substrate at a frequency of 10 GHz were measured. Table 7 shows the results.

The fluorine resin substrate had no molding defects, and a strong fluorine resin substrate having a small coefficient of thermal expansion was obtained. The substrate had dielectric characteristics of great transmission loss: a dielectric loss tangent of 0.0012 at 10 GHz; and a dielectric constant of 3.9 at 10 GHz. In addition, the variation in dielectric loss tangent within the substrate was large, and the substrate lacked reliability.

TABLE 7

| Example/Comparative Example | Example 9 | Comparative Example 8 |
|---|---|---|
| Quartz glass cloth No. | SG2 | — |
| Low dielectric glass cloth No. | — | LEG*1 |
| Dielectric loss tangent of glass cloth at 10 GHz | 0.0002 | 0.0020 |
| Dielectric constant of glass cloth at 10 GHz | 3.3 | 4.4 |
| Low dielectric resin | PTFE | PTFE |
| Dielectric loss tangent of low dielectric resin at 10 GHz | 0.0002 | 0.0002 |
| Dielectric constant of low dielectric resin at 10 GHz | 2.1 | 2.1 |
| Silica powder No. | SP1 | SP1 |
| Dielectric loss tangent of silica powder at 10 GHz | 0.0002 | 0.0002 |
| Dielectric constant of silica powder at 10 GHz | 3.3 | 3.3 |
| Dielectric loss tangent of substrate at 10 GHz | 0.0002 | 0.0012 |
| Dielectric constant of substrate at 10 GHz | 3.4 | 3.9 |
| Molding defects | none | none |
| Difference between members in dielectric loss tangent *2 | good | poor |
| Substrate uniformity *3 | good | poor |

*1 Low dielectric LE glass cloth
*2 The difference in dielectric loss tangent was within the range of −20% to +50%: good outside the range of −20% to +50%: poor
*3 Substrate uniformity
The difference in dielectric loss tangent was within the range of −20% to +50%: outside the range of −20% to +50%: poor

[Examples 10 to 12, Comparative Example 9] Evaluation of Transmission Properties by Skew Using the prepregs of Example 1, Example 4, Example 8, and Comparative Example 1, the following evaluation substrates were fabricated to investigate the relationship between the angles of the differential wirings and skew. Table 8 shows the results.

Substrate Specifications and Evaluation Parameter
1) Used prepreg: A (Example 1), B (Example 4), C (Example 8), and D (Comparative Example 1)
2) Wiring specifications: differential 100Ω (L/S=0.12 mm/0.25 mm)
3) Wiring length: 200 mm
4) Wiring angle: 0 degrees, 10 degrees

TABLE 8

| | Example/Comparative Example | | | | | | | |
|---|---|---|---|---|---|---|---|---|
| | Example 10 | | Example 11 | | Example 12 | | Comparative Example 9 | |
| Prepreg No. | Example 1 | | Example 4 | | Example 8 | | Comparative Example 1 | |
| Wiring angle (degrees) | 0 | 10 | 0 | 10 | 0 | 10 | 0 | 10 |
| Maximum value/minimum value of skew (times) | 1.2 | 1.1 | 1.8 | 1.2 | 2.2 | 1.3 | 8.5 | 3.7 |

As shown in Table 8, the substrates of the present invention (Examples 10 to 12) including the prepregs of Example 1, Example 4, and Example 8 respectively, having little difference in dielectric constant and dielectric loss tangent had little effect on the skew value due to the wiring angle, and circuit boards can be manufactured easily. The substrate fabricated from the prepreg of Comparative Example 1 (Comparative Example 9) had a great variation in skew, and it is necessary to deal with material, design, and production comprehensively in substrate manufacturing.

As described above, by using the inventive low dielectric substrate for high-speed millimeter-wave communication, it is possible to fabricate an ideal substrate having very little transmission loss and skew in high-speed communication using millimeter waves or the like.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A low dielectric substrate for high-speed millimeter-wave communication, the low dielectric substrate comprising:
 a quartz glass cloth having a dielectric loss tangent of 0.0001 to 0.0015 at 10 GHz and a dielectric constant of 3.0 to 3.8 at 10 GHz; and
 a maleimide resin having a dielectric loss tangent within a range of 80% to 150% of the dielectric loss tangent of the quartz glass cloth at 10 GHz and a dielectric constant within a range of 50% to 110% of the dielectric constant of the quartz glass cloth at 10 GHz.

2. The low dielectric substrate according to claim 1, further comprising a silica powder having an average particle size of 30 μm or less.
3. The low dielectric substrate according to claim 2, wherein the silica powder has a dielectric loss tangent of 0.0001 to 0.0015 at 10 GHz and a dielectric constant of 3.0 to 3.8 at 10 GHz.
4. The low dielectric substrate according to claim 3, wherein the maleimide resin has a dielectric loss tangent of 0.0001 to 0.0020 at 10 GHz and a dielectric constant of 2.0 to 4.0 at 10 GHz.
5. The low dielectric substrate for high-speed millimeter-wave communication according to claim 3, having a dielectric loss tangent of 0.0001 to 0.0015 at 10 GHz and a dielectric constant of 2.0 to 3.8 at 10 GHz.
6. The low dielectric substrate according to claim 3, wherein the maleimide resin is a bismaleimide resin.
7. The low dielectric substrate according to claim 6, wherein:
 the low dielectric substrate has a dielectric loss tangent of 0.0001 to 0.0005 at 10 GHz and a dielectric constant of 2.2 to 3.7 at 10 GHz, and
 the bismaleimide resin is represented by the following general formula (1):

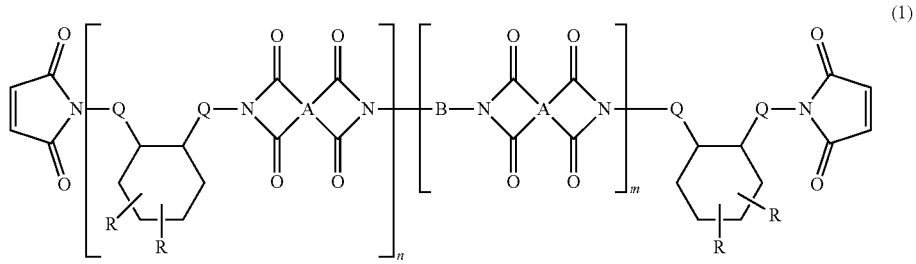

wherein:
 A independently represents a tetravalent organic group including an aromatic ring or an aliphatic ring;
 B represents an alkylene chain having 6 to 18 carbon atoms and having an aliphatic ring that may contain a divalent heteroatom;
 Q independently represents a linear alkylene group having 6 or more carbon atoms;
 R independently represents a linear or branched alkyl group having 6 or more carbon atoms;
 "n" represents a number of 1 to 10; and
 "m" represents a number of 0 to 10.
8. The low dielectric substrate according to claim 2, wherein the maleimide resin has a dielectric loss tangent of 0.0001 to 0.0020 at 10 GHz and a dielectric constant of 2.0 to 4.0 at 10 GHz.
9. The low dielectric substrate according to claim 2, having a dielectric loss tangent of 0.0001 to 0.0015 at 10 GHz and a dielectric constant of 2.0 to 3.8 at 10 GHz.
10. The low dielectric substrate according to claim 2, wherein the maleimide resin is a bismaleimide resin.
11. The low dielectric substrate according to claim 10, wherein:
 the low dielectric substrate has a dielectric loss tangent of 0.0001 to 0.0005 at 10 GHz and a dielectric constant of 2.2 to 3.7 at 10 GHz, and
 the bismaleimide resin is represented by the following general formula (1):

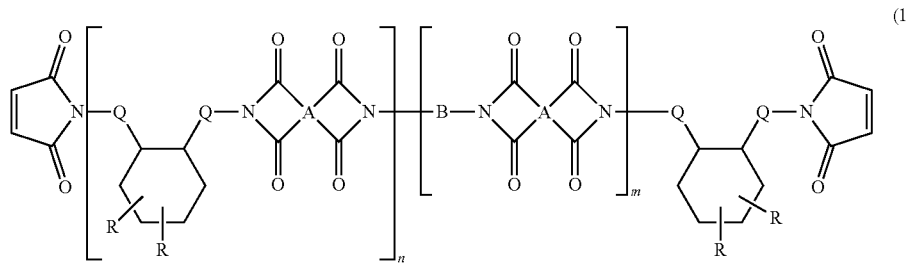

wherein:
  A independently represents a tetravalent organic group including an aromatic ring or an aliphatic ring;
  B represents an alkylene chain having 6 to 18 carbon atoms and having an aliphatic ring that may contain a divalent heteroatom;
  Q independently represents a linear alkylene group having 6 or more carbon atoms;
  R independently represents a linear or branched alkyl group having 6 or more carbon atoms;
  "n" represents a number of 1 to 10; and
  "m" represents a number of 0 to 10.

12. The low dielectric substrate according to claim 1, wherein the maleimide resin has a dielectric loss tangent of 0.0001 to 0.0020 at 10 GHz and a dielectric constant of 2.0 to 4.0 at 10 GHz.

13. The low dielectric substrate for high-speed millimeter-wave communication according to claim 12, having a dielectric loss tangent of 0.0001 to 0.0015 at 10 GHz and a dielectric constant of 2.0 to 3.8 at 10 GHz.

14. The low dielectric substrate according to claim 12, wherein the maleimide resin is a bismaleimide resin.

15. The low dielectric substrate according to claim 14, wherein:
  the low dielectric substrate has a dielectric loss tangent of 0.0001 to 0.0005 at 10 GHz and a dielectric constant of 2.2 to 3.7 at 10 GHz, and
  the bismaleimide resin is represented by the following general formula (1):

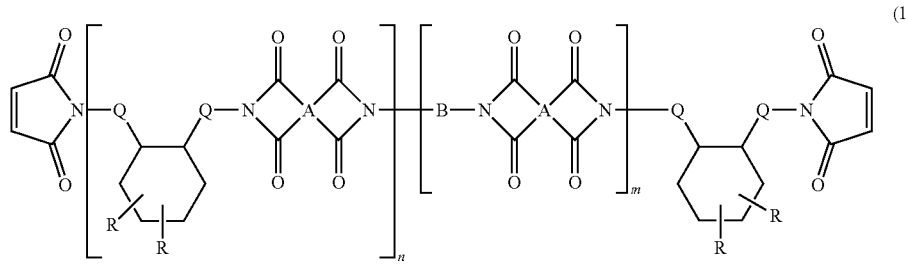

wherein:
  A independently represents a tetravalent organic group including an aromatic ring or an aliphatic ring;
  B represents an alkylene chain having 6 to 18 carbon atoms and having an aliphatic ring that may contain a divalent heteroatom;
  Q independently represents a linear alkylene group having 6 or more carbon atoms;
  R independently represents a linear or branched alkyl group having 6 or more carbon atoms;
  "n" represents a number of 1 to 10; and
  "m" represents a number of 0 to 10.

16. The low dielectric substrate according to claim 1, having a dielectric loss tangent of 0.0001 to 0.0015 at 10 GHz and a dielectric constant of 2.0 to 3.8 at 10 GHz.

17. The low dielectric substrate according to claim 16, wherein the maleimide resin is a bismaleimide resin.

18. The low dielectric substrate according to claim 17, wherein:

the low dielectric substrate has a dielectric loss tangent of 0.0001 to 0.0005 at 10 GHz and a dielectric constant of 2.2 to 3.7 at 10 GHz, and the bismaleimide resin is represented by the following general formula (1):

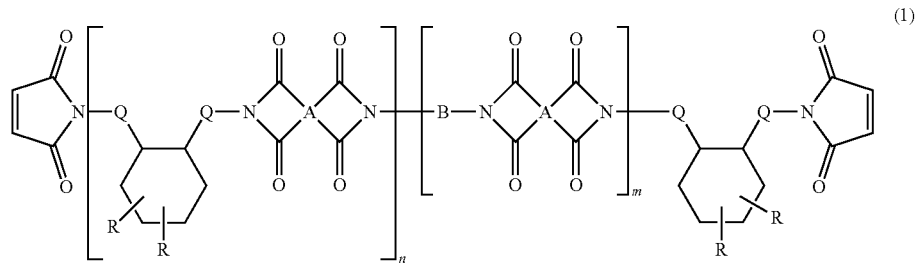

wherein:
A independently represents a tetravalent organic group including an aromatic ring or an aliphatic ring;
B represents an alkylene chain having 6 to 18 carbon atoms and having an aliphatic ring that may contain a divalent heteroatom;
Q independently represents a linear alkylene group having 6 or more carbon atoms;
R independently represents a linear or branched alkyl group having 6 or more carbon atoms;
"n" represents a number of 1 to 10; and
"m" represents a number of 0 to 10.

19. The low dielectric substrate according to claim 1, wherein the maleimide resin is a bismaleimide resin.

20. The low dielectric substrate according to claim 19, wherein:
the low dielectric substrate has a dielectric loss tangent of 0.0001 to 0.0005 at 10 GHz and a dielectric constant of 2.2 to 3.7 at 10 GHz, and
the bismaleimide resin is represented by the following general formula (1):

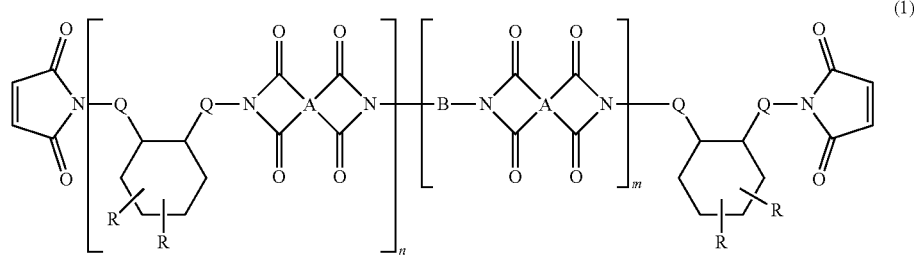

wherein:

A independently represents a tetravalent organic group including an aromatic ring or an aliphatic ring;
B represents an alkylene chain having 6 to 18 carbon atoms and having an aliphatic ring that may contain a divalent heteroatom;
Q independently represents a linear alkylene group having 6 or more carbon atoms;
R independently represents a linear or branched alkyl group having 6 or more carbon atoms;
"n" represents a number of 1 to 10; and
"m" represents a number of 0 to 10.

* * * * *